(12) United States Patent
Chi

(10) Patent No.: US 8,841,945 B2
(45) Date of Patent: Sep. 23, 2014

(54) SEMICONDUCTOR DEVICE AND METHOD OF DRIVING THE SAME

(71) Applicant: SK hynix Inc., Gyeonggi-do (KR)

(72) Inventor: Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/717,641

(22) Filed: Dec. 17, 2012

(65) Prior Publication Data
US 2014/0062546 A1 Mar. 6, 2014

(30) Foreign Application Priority Data

Aug. 28, 2012 (KR) .................. 10-2012-0094453

(51) Int. Cl.
*H03L 7/00* (2006.01)
*H03K 5/13* (2014.01)
*H03H 11/26* (2006.01)

(52) U.S. Cl.
CPC ............ *H03H 11/26* (2013.01); *G03H 11/265* (2013.01); *H03K 5/131* (2013.01)
USPC ............................ 327/142; 327/143; 327/198

(58) Field of Classification Search
USPC .............. 327/141, 144–163; 331/1 A, 15–17; 375/373–376
See application file for complete search history.

(56) References Cited

U.S. PATENT DOCUMENTS

| 2004/0160279 A1* | 8/2004 | Jouen et al. ...................... 331/16 |
| 2004/0217790 A1* | 11/2004 | Saeki ............................. 327/158 |
| 2010/0245597 A1* | 9/2010 | Pai et al. ..................... 348/207.1 |
| 2012/0019288 A1* | 1/2012 | Badillo ......................... 327/115 |
| 2012/0027143 A1* | 2/2012 | Wang et al. ................... 375/354 |
| 2012/0027243 A1* | 2/2012 | Imamura et al. ............. 381/389 |
| 2013/0285724 A1* | 10/2013 | Staszewski et al. ........... 327/159 |

FOREIGN PATENT DOCUMENTS

KR 1020050067459 7/2005

* cited by examiner

*Primary Examiner* — Brandon S Cole
(74) *Attorney, Agent, or Firm* — IP & T Group LLP

(57) ABSTRACT

A semiconductor device includes a division unit configured to divide an oscillation signal and to generate a plurality of divided signals having different division ratios each other, a delay amount determination unit configured to combine an source signal, the oscillation signal, and the plurality of divided signals and to generate a delay amount information signal with information on a given delay amount, and an edge-delayed signal output unit configured to generate at least one edge-delayed signal corresponding to the given delay amount in response to the source signal and the delay amount information signal.

19 Claims, 7 Drawing Sheets

SEMICONDUCTOR DEVICE AND METHOD OF DRIVING THE SAME

CROSS-REFERENCE TO RELATED APPLICATIONS

The present application claims priority of Korean Patent Application No. 10-2012-0094453, filed on Aug. 28, 2012, which is incorporated herein by reference in its entirety.

BACKGROUND

1. Field

Exemplary embodiments of the present invention relate to semiconductor design technology, and more particularly, to a semiconductor device with an edge-delayed signals generation circuit and a method of driving the same.

2. Description of the Related Art

In general, two or more delay circuits are used to generate edge-delayed signals by delaying an enable edge and a disable edge of one signal, respectively. For example, to obtain an enabling signal for a bit line sense amplifier and a driving signal for a word line, a first delay circuit for delaying the rising edge of an active signal and a second delay circuit for delaying the falling edge of the active signal may be used.

When the delay circuits are used as described above, the generation of accurate signals are limited because delay amounts set in respective delay circuits are not the same in view of design characteristics. That is, there is a problem in that the edge-delayed signals whose enable edge or disable edge have been delayed by a specific delay amount are not generated. Furthermore, if the delay circuits are formed of a D flip-flop chain or an inverter chain, it may not be possible to obtain a precise delay amount and to reduce a circuit area due to the delay circuits that are overlapped.

SUMMARY

Exemplary embodiments of the present invention are directed to a semiconductor device for obtaining edge-delayed signals with an accurate and precise delay amount.

In accordance with an embodiment of the present invention, a semiconductor device includes a division unit configured to divide an oscillation signal and to generate a plurality of divided signals having different division ratios each other, a delay amount determination unit configured to combine an source signal, the oscillation signal, and the plurality of divided signals and to generate a delay amount information signal with information on a given delay amount; and an edge-delayed signal output unit configured to generate at least one edge-delayed signal corresponding to the given delay amount in response to the source signal and the delay amount information signal.

In accordance with another embodiment of the present invention, a semiconductor device includes an oscillation unit configured to generate an oscillation signal in response to an enable signal, a division unit configured to divide the oscillation signal and to generate a plurality of divided signals having different division ratios each other in response to the enable signal, a first delay amount determination unit configured to combine a source signal, the oscillation signal, and the plurality of divided signals and to generate a first delay amount information signal with information on a given delay amount, a second delay amount determination unit configured to combine the inverted source signal, the oscillation signal, and the plurality of divided signals and to generate a second delay amount information signal with the information on the given delay amount, and a first edge-delayed signal output unit configured to generate a first edge-delayed signal with an enable edge, which is more delayed than an enable edge of the source signal by the given delay amount in response to the first delay amount information signal, and with a disable edge, which is more delayed than a disable edge of the source signal by the given delay amount in response to the second delay amount information signal.

In accordance with yet another embodiment of the present invention, a method of driving a semiconductor device includes counting an oscillation signal when an active signal is enabled and enabling a first delay amount information signal after a first period corresponding to a given delay amount, and counting the oscillation signal when the active signal is disabled and enabling a second delay amount information signal after a second period corresponding to the given delay amount; and generating a first edge-delayed signal and a second edge-delayed signal, obtained by delaying a rising edge and a falling edge of the active signal by the given delay amount, in response to the active signal and the first and the second delay amount information signals.

DETAILED DESCRIPTION

Figure 1:
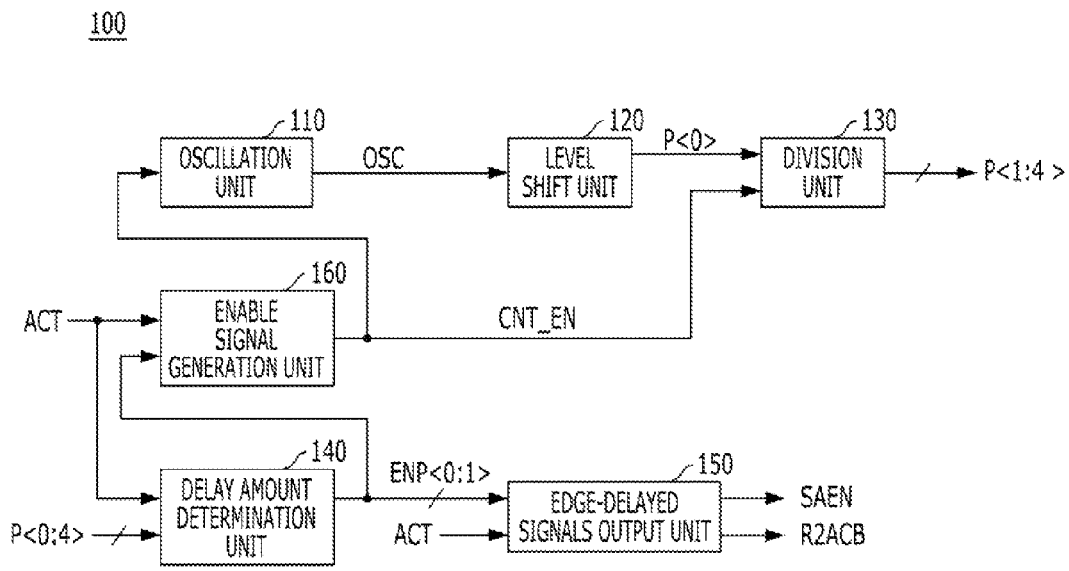
FIG. 1 is a block diagram illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a semiconductor device in accordance with an embodiment of the present invention.

Referring to FIG. 1, the semiconductor device 100 includes an oscillation unit 110 configured to generate an oscillation signal OSC in response to an enable signal CNT_EN, a level shift unit 120 configured to convert a swing width of the oscillation signal OSC at a given voltage level, a division unit 130 configured to generate a plurality of divided signals P<1: 4> in response to the enable signal CNT_EN and a division source signal P<0> outputted from the level shift unit 120, a delay amount determination unit 140 configured to generate first and second delay amount information signals ENP<0:1> each having information on a given delay amount by combining an active signal ACT, the division source signal P<0>, and the plurality of divided signals P<1:4>, an edge-delayed signals output unit 150 configured to generate first and second internal control signals SAEN and R2ACB, obtained by delaying at least one of the enable edge and the disable edge of the active signal ACT by the given delay amount, in response to the first and the second delay amount information signals ENP<0:1>, and an enable signal generation unit 160 configured to generate the enable signal CNT_EN in response to the active signal ACT and the first and the second delay amount information signals ENP<0:1>.

Figure 2:
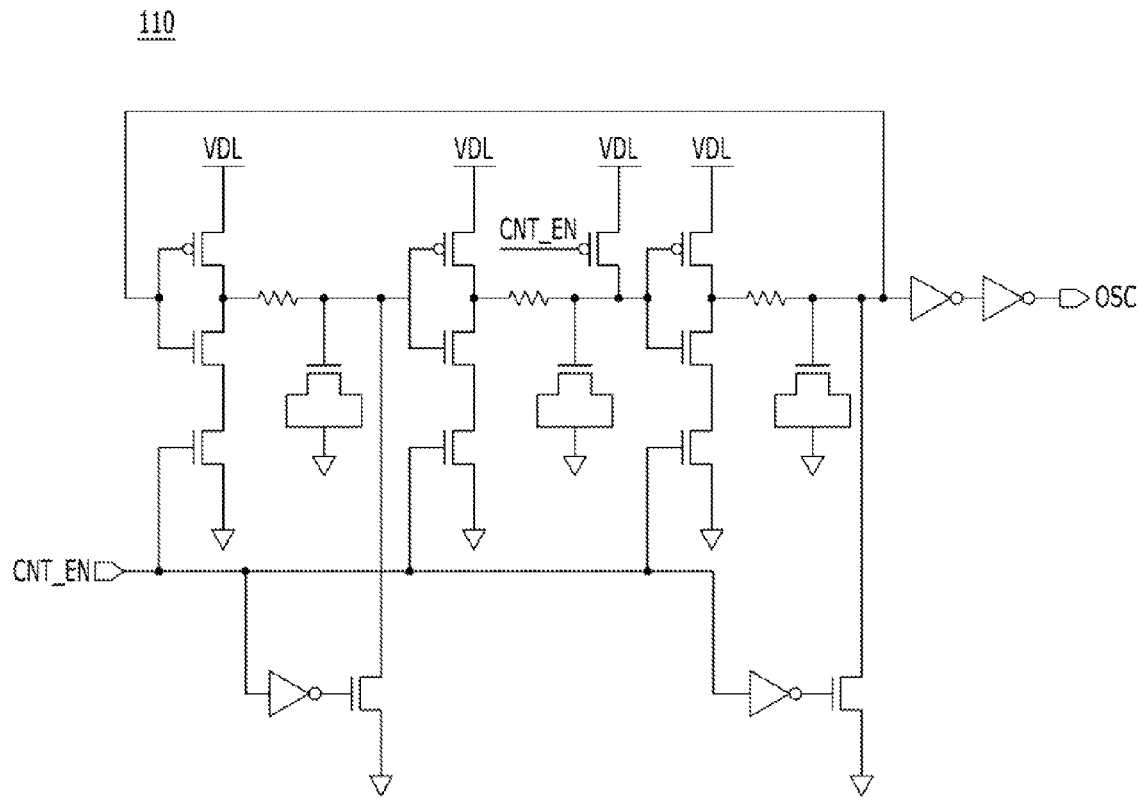
FIG. 2 is a detailed diagram illustrating an example of an oscillation unit shown in FIG. 1.

FIG. 2 is a detailed diagram illustrating the oscillation unit 110 shown in FIG. 1.

As shown in FIG. 2 the oscillation unit 110 preferably uses an internal voltage VDL as a driving voltage. The internal voltage VDL is more insensitive to a voltage variance than a power source voltage (for example, VDD), and thus the oscillation unit 110 using the internal voltage VDL may normally generate the oscillation signal OSC having a given cycle. In an embodiment of the present invention, the oscillation signal OSC becomes a basis for calculating a given delay amount. Thus, when the oscillation signal USC is normally generated in a desired cycle as described above, accuracy improves when determining a necessary delay amount.

Figure 3:
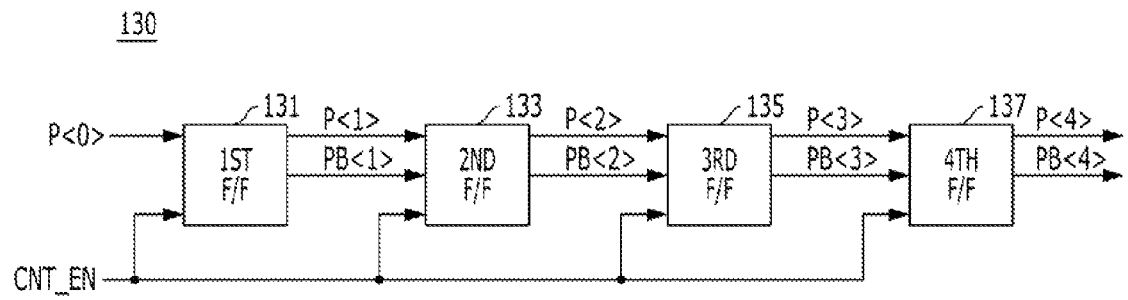
FIG. 3 is a detailed diagram illustrating an example of a division unit shown in FIG. 1.

FIG. 3 is a detailed diagram illustrating the division unit 130 shown in FIG. 1.

As shown in FIG. 3, the division unit 130 has a structure in which first to fourth flip-flops (F/Fs) 131, 133, 135, and 137 are coupled in series. Each of the F/Fs 131, 133, 135, and 137 output the respective divided signals P<1:4> by bisecting the input signals P<:3> in response to the enable signal CNT_EN. For example, the first to fourth F/Fs 131, 133, 135, and 137 may be formed of respective 3K flip-flops. The division unit 130 constructed as described above are known in the art, and thus a detailed description thereof is omitted.

Figure 4:
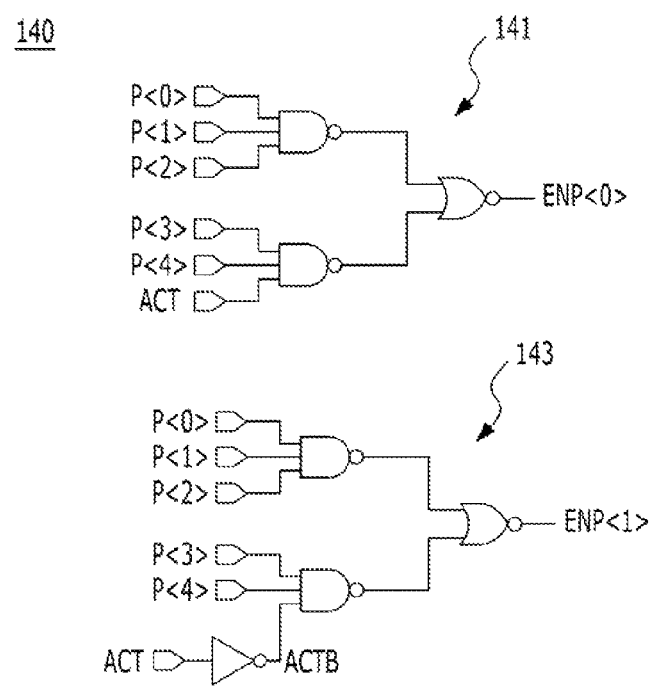
FIG. 4 is a detailed diagram illustrating an example of a delay amount determination unit shown in FIG. 1.

FIG. 4 is a detailed diagram illustrating the delay amount determination unit 140 shown in FIG. 1.

As shown in FIG. 4, the delay amount determination unit 140 includes a first delay amount determination section 141 configured to generate the first delay amount information signal ENP<0> corresponding to a given delay amount by logically combining the division source signal P<0>, the active signal ACT, and the plurality of divided signals P<1: 4>. The delay amount determination unit 140 also may include a second delay amount determination section 143 configured to generate the second delay amount information signal ENP<1> corresponding to a given delay amount by logically combining the division source signal P<0>, an inverted active signal ACTB, and the plurality of divided signals P<1:4>. The first delay amount determination section 141 enables the first delay amount information signal ENP<0> when the division source signal P<0>, the active signal ACT, and the plurality of divided signals P<1:4> have a given code value. The second delay amount determination section 143 enables the second delay amount information signal ENP<1> when the division source signal P<0>, the inverted active signal ACTB, and the plurality of divided signals P<1:4> have a given code value.

Figure 5:
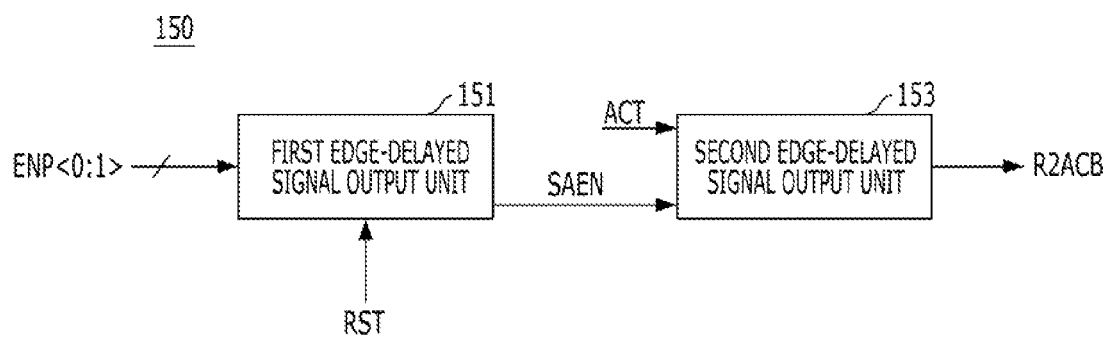
FIG. 5 is a detailed diagram illustrating an example of an edge-delayed signals output unit shown in FIG. 1.

FIG. 5 is a detailed diagram illustrating the edge-delayed signals output unit 150 shown in FIG. 1.

As shown in FIG. 5, the edge-delayed signals output unit 150 includes a first edge-delayed signal output unit 151 for generating the first internal control signal SAEN in response to the first and the second delay amount information signals ENP<0:1> and a second edge-delayed signal output unit 153 for generating the second internal control signal R2ACB in response to the active signal ACT and the first internal control signal SAEN.

Figure 6A:
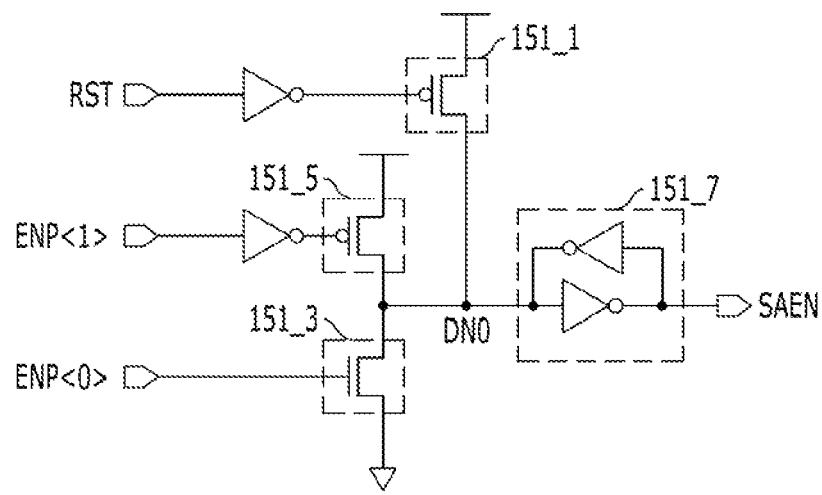
FIG. 6A is a detailed diagram illustrating an example of a first edge delay unit shown in FIG. 5.

FIG. 6A is a detailed diagram illustrating the first edge-delayed signal output unit 151 shown in FIG. 5.

As shown in FIG. 6A, the first edge-delayed signal output unit 151 includes a first driving unit 151_1 configured to drive a first driving node DN0 at a first voltage (for example, VDD) in response to a reset signal RST, a second driving unit 151_3 configured to drive the first driving node DN0 at a second voltage (for example, VSS) in response to the first delay amount information signal ENP<0>, a third driving unit 151_5 configured to drive the first driving node DN0 at a first voltage (for example, VDD) in response to the inverted signal of the second delay amount information signal ENP<1>, and a first latch unit 151_7 coupled between the first driving node DN0 and the output node of the first internal control signal SAEN. The first edge-delayed signal output unit 151 configured as described above generates the first internal control signal SAEN, which has the enable edge that is delayed more than the enable edge of the active signal ACT by a given delay amount in response to the first delay amount information signal ENP<0> and the disable edge that is delayed more than the disable edge of the active signal ACT by a given delay amount in response to the second delay amount information signal ENP<1>.

Figure 6B:
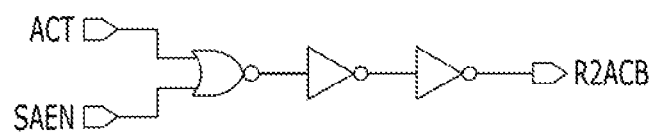
FIG. 6B is a detailed diagram illustrating an example of a second edge delay unit shown in FIG. 5.

FIG. 6B is a detailed diagram illustrating the second edge-delayed signal output unit 153 shown in FIG. 5.

As shown in FIG. 68, the second edge-delayed signal output unit 153 includes a NOR gate configured to perform a NOR operation on the active signal ACT and the first internal control signal SAEN and two inverters coupled in series between the output node of the NOR gate and the output node of the second internal control signal R2ACB. The second edge-delayed signal output unit 153 configured as described above generates the second internal control signal R2ACB, which has the enable edge that corresponds to the enable edge of the active signal ACT and the disable edge that corresponds to the disable edge of the first internal control signal SAEN. For example, the first internal control signal SAEN may be used as a signal for enabling a bit line sense amplifier (BLSA), and the second internal control signal R2ACB may be used as a signal for driving a word line.

Figure 7:
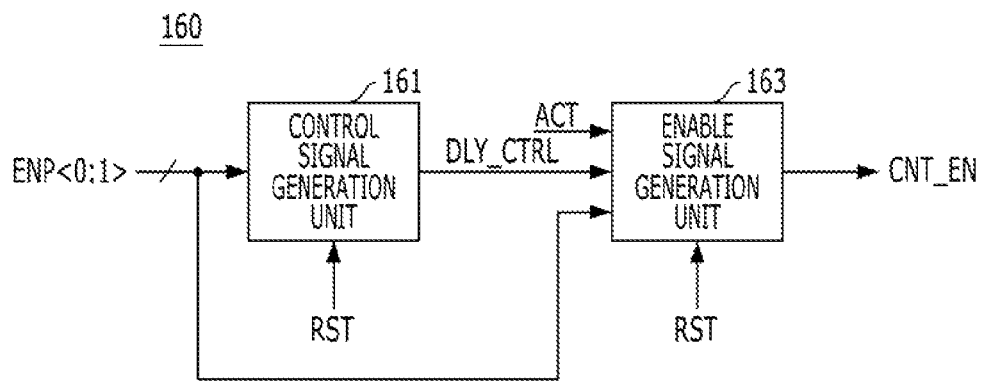
FIG. 7 is a detailed diagram illustrating an example of an enable signal generation unit shown in FIG.

FIG. 7 is a detailed diagram illustrating the enable signal generation unit 160 shown in FIG. 1.

As shown in FIG. 7, the enable signal generation unit 160 includes a control signal generation unit 161 for generating a control signal DLY_CTRL in response to the first and the second delay amount information signals ENP<0:1> and an enable signal generation unit 163 for generating the enable signal CNT_EN in response to the control signal DLY_C-TRL, the active signal ACT, and the first and the second delay amount information signals ENP<0:1>.

Figure 8A:
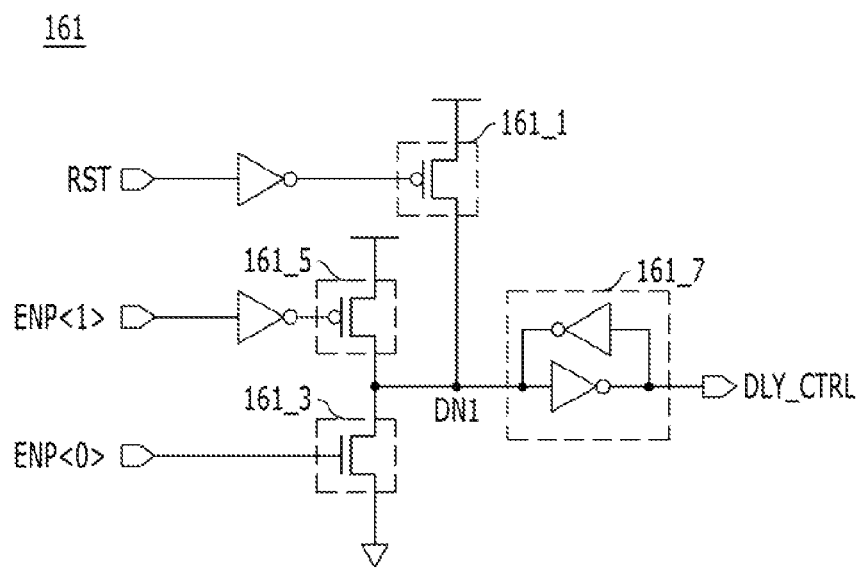
FIG. 8A is a detailed diagram illustrating an example of a control signal generation unit shown in FIG. 7.

FIG. 8A is a detailed diagram illustrating the control signal generation unit 161 shown in FIG. 7.

As shown in FIG. 8A, the control signal generation unit 161 includes a fourth driving unit 161_1 configured to drive a second driving node DN1 at a first voltage in response to the reset signal RST, a fifth driving unit 161_3 configured to drive the second driving node DN1 at a second voltage (for example, VSS) in response to the first delay amount information signal ENP<0>, a sixth driving unit 161_5 configured to drive the second driving node DN1 at the first voltage in response to the inverted signal of the second delay amount information signal ENP<1>, and a second latch unit 161_7 coupled between the second driving node DN1 and the output node of the control signal DLY_CTRL. The enable signal generation unit 163 generates the enable signal CNT_EN that is enabled when the active signal ACT is enabled, disabled when the first delay amount information signal ENP<0> is enabled, enabled when the active signal ACT is disabled, and disabled when the second delay amount information signal ENP<1> is enabled.

Figure 8B:
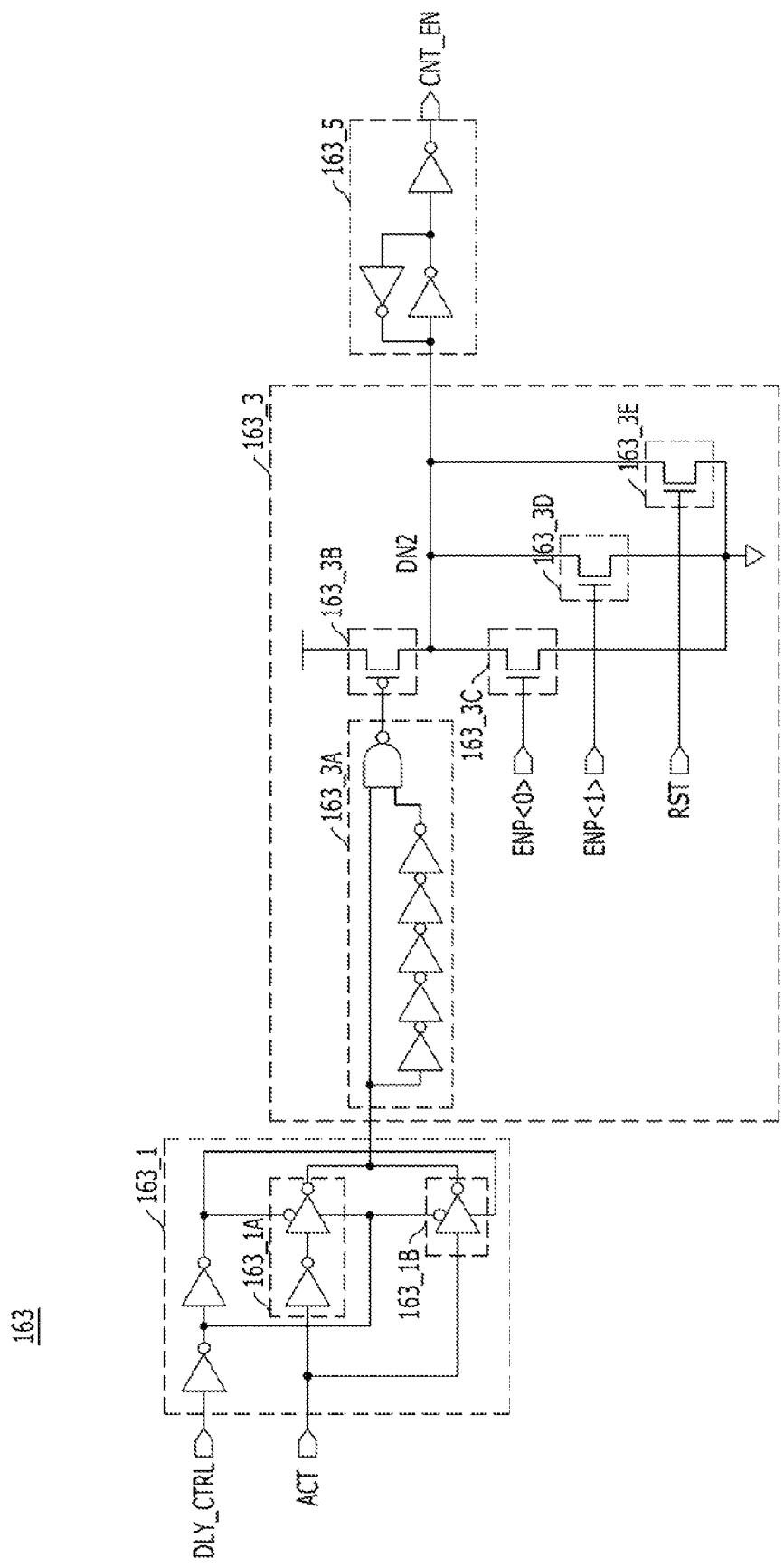
FIG. 8B is a detailed diagram illustrating an example of an enable signal generation unit shown in FIG. 7.

FIG. 8B is a detailed diagram showing the enable signal generation unit 163 shown in FIG. 7.

As shown in FIG. 8B, the enable signal generation unit 163 includes an output control unit 163_1 configured to output the active signal ACT or the inverted active signal in response to the control signal DLY_CTRL, a driving unit 163_3 configured to drive a third driving node DN2 at a given voltage in response to the output signal of the output control unit 163_1, the reset signal RST, and the first and the second delay amount information signals ENP<0:1>, and a third latch unit 163_5 coupled in series between the third driving node DN2 and the output node of the enable signal CNT_EN. The output control unit 163_1 includes a first path providing unit 163_1A for non-inverting and outputting the active signal ACT in response to the control signal DLY_CTRL and a second path providing unit 163_1B for inverting the active signal ACT and outputting an inverted signal in response to the control signal DLY_CTRL. The driving unit 1633 includes a pulse signal generation unit 163_3A for generating a pulse signal that is enabled for a given pulse period when the output signal of the output control unit 163_1 shifts, a seventh driving unit 163_3B for driving the third driving node DN2 at a first voltage in response to the pulse signal, an eighth driving unit 163_3C for driving the third driving node DN2 at a second voltage in response to the first delay amount information signal ENP<0> a ninth driving unit 163_3D for driving the third driving node DN2 at a second voltage in response to the second delay amount information signal ENP<1, and a tenth driving unit 163_3E for driving the third driving node DN2 at the second voltage in response to the reset signal RST.

Figure 9:
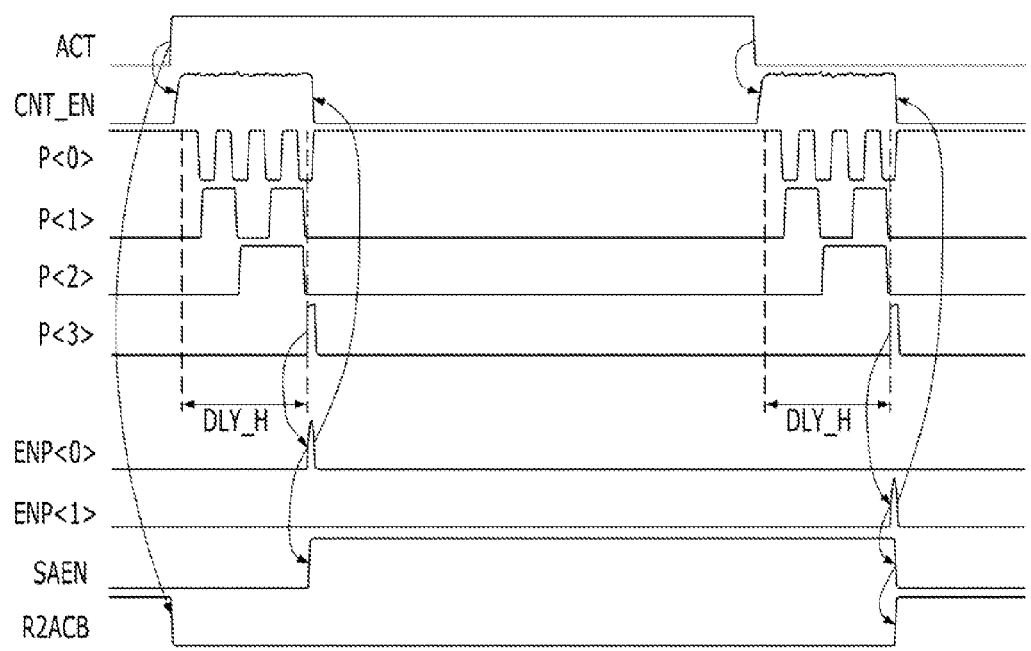
FIG. 9 is a timing diagram for explaining a method of driving a semiconductor device in accordance with the embodiment of the present invention.

FIG. 9 is a timing diagram for explaining the method of driving the semiconductor device 100 in accordance with the embodiment of the present invention.

Referring to FIG. 9, in the method of driving the semiconductor device 100, the division source signal P<0> is counted when the active signal ACT is enabled, and the first delay amount information signal ENP<0> is enabled after a first period corresponding to a given delay amount DLY_H. Next, the division source signal P<0> is counted when the active signal ACT is disabled, and the second delay amount information signal ENP<1> is enabled after a second period corresponding to the given delay amount DLY_H. Next, the first and the second internal control signals SAEN and R2ACB, which are obtained by delaying one or more of the enable edge and disable edge of the active signal ACT by the given delay amount DLY_H, are generated in response to the active signal ACT and the first and the second delay amount information signals ENP<0:1>.

Here, a method for generating the first and the second delay amount information signals ENP<0:1> is as follows. First, the oscillation unit 110 generates the oscillation signal OSC having a given frequency in response to the enable signal CNT_EN. The level shift unit 120 generates the division source signal P<0> by shifting the voltage level of the oscillation signal OSC. The division unit 130 generates the first to fourth divided signals P<1:4> corresponding to the division source signal P<0>. The delay amount calculation unit 140 enables the first delay amount information signal ENP<0> when a logical combination of the active signal ACT, the first to fourth divided signals P<1:4>, and the division source signal P<0> has a code value corresponding to the given delay amount DLY_H. The delay amount calculation unit 140 also enables the second delay amount information signal ENP<1> when a logical combination of the inverted active signal ACT, the first to fourth divided signals P<1:4>, and the division source signal P<0> has a code value corresponding to the given delay amount DLY_H.

Furthermore, a method of generating the first and the second internal control signals SAEN and R2ACB is as follows. The first edge-delayed signal output unit 151 generates the first internal control signal SAEN in response to the first and the second delay amount information signals ENP<0:1>, and the second edge-delayed signal output unit 153 generates the second internal control signal R2ACB in response to the active signal ACT and the first internal control signal SAEN. For example, the first internal control signal SAEN may be used as an enable signal for enabling a bit line sense amplifier (BLSA), and the second internal control signal R2ACB may be used as a driving signal for driving a word line.

Meanwhile, the division source signal P<0> is generated during the first and the second sections in which the enable signal CNT_EN is enabled. The enable signal CNT_EN is enabled from a time point at which the active signal ACT is enabled to a time point at which the first delay amount information signal ENP<0> is enabled. The enable signal CNT_EN is also enabled from a time point at which the active signal ACT is disabled to a time point at which the second delay amount information signal ENP<1> is enabled. This is described in more detail below.

First, the control signal generation unit 161 outputs the control signal DLY_CTRL of a logic low level in response to the reset signal RST, and the enable signal generation unit 163 outputs the enable signal CNT_EN of a logic low level in response to the reset signal RST. At this time, the first path providing unit 163_1A of the output control unit 163_1 of the enable signal generation unit 163 is enabled in response to the control signal DLY_CTRL.

In this state, when the active signal ACT shifts from a logic tow level to a logic high level, the pulse signal generation unit 163_3A outputs a pulse signal of a logic low level during a given pulse period in response to the active signal ACT transferred through the first path providing unit 163_1A. In response thereto, when the seventh driving unit 163_3B drives the third driving node DN2 at a first voltage (for example, VDD) in response to the pulse signal the third latch unit 163_5 outputs the enable signal CNT_EN of a logic high level.

Furthermore, when the active signal ACT shifts to a logic high level and the first delay amount information signal ENP<0> is enabled after the first section, the enable signal generation unit 163 outputs the enable signal CNT_EN of a logic low level. That is, when the eighth driving unit 163_3C drives the third driving node DN2 at a second voltage (for example, VSS) in response to the first delay amount information signal ENP<0>, the third latch unit 163_5 outputs the enable signal CNT_EN of a logic low level. At the same time, the control signal generation unit 161 outputs the control signal DLY_CTRL of a logic high level in response to the first delay amount information signal ENP<0>, and the second path providing unit 163_1B of the output control unit 163_1 is enabled in response to the control signal DLY_CTRL.

Next, when the active signal ACT shifts from a logic high level to a logic low level, the pulse signal generation unit 163_3A outputs a pulse signal of a logic low level during a given pulse period in response to an inverted active signal transferred through the second path providing unit 163_1B. When the seventh driving unit 163_3B drives the third driving node DN2 at the first voltage in response to the pulse signal, the third latch unit 163_5 outputs the enable signal CNT_EN of a logic high level.

Next, when the active signal ACT is disabled to a logic low level and the second delay amount information signal ENP<1> is enabled after the second section, the enable signal generation unit 163 outputs the enable signal CNT_EN of a logic low level. That is, when the ninth driving unit 163_3D drives the third driving node DN2 at the second voltage in response to the second delay amount information signal ENP<1> the third latch unit 163_5 outputs the enable signal CNT_EN of a logic low level. At this time, the control signal generation unit 161 outputs the control signal DLY_CTRL of a logic low level in response to the second delay amount information signal ENP<1> and the first path providing unit 163_1A of the output control unit 163_1 remains enabled in response to the control signal DLY_CTRL.

In accordance with an embodiment of the present invention, there may be an advantage in that a necessary delay amount may be obtained accurately and precisely using an oscillation signal. In particular, there may be an advantage in that an internal control signal having an enable edge and a disable edge delayed by a specific delay amount may be generated by incorporating an obtained delay amount into the enable edge and disable edge of a target delay signal, if it sought to delay both the enable edge and the disable edge of the target delay signal.

Furthermore, there may be advantages in that a control signal having enable and disable edges delayed by a specific delay amount in response to the enable and disable edges of an input signal may be generated and a circuit area may be reduced as compared with a conventional circuit because both the enable edge and disable edge of the input signal may be delayed by one circuit for delay.

In addition, there may be an advantage in that a control signal may be generated on accurate timing because a necessary delay amount may be precisely calculated using the oscillation signal.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a division unit configured to divide an oscillation signal and to generate a plurality of divided signals having different division ratios each other;
a delay amount determination unit configured to combine a source signal, the oscillation signal, and the plurality of divided signals and to generate a delay amount information signal with information on a given delay amount; and
an edge-delayed signal output unit configured to generate at least one edge-delayed signal corresponding to the given delay amount in response to the source signal and the delay amount information signal.

2. The semiconductor device of claim 1, wherein the edge-delayed signal output unit generates a rising edge-delayed signal and a falling edge-delayed signal in response to the source signal and the delay amount information signal.

3. The semiconductor device of claim 1, further comprising an oscillation unit configured to generate the oscillation signal in response to an enable signal and supply the oscillation signal to the division unit, wherein the division unit generates the plurality of divided signals corresponding to the oscillation signal in response to the enable signal.

4. The semiconductor device of claim 3, wherein the oscillation unit receives an internal voltage as a driving voltage and the oscillation signal is level-shifted before supplied to the division unit.

5. The semiconductor device of claim 3, further comprising an enable signal generation unit configured to generate the enable signal enabled in response to the source signal and disabled in response to the delay amount information signal.

6. A semiconductor device, comprising:
an oscillation unit configured to generate an oscillation signal in response to an enable signal;
a division unit configured to divide the oscillation signal and to generate a plurality of divided signals having different division ratios each other in response to the enable signal;
a first delay amount determination unit configured to combine a source signal, the oscillation signal, and the plurality of divided signals and to generate a first delay amount information signal with information on a given delay amount;
a second delay amount determination unit configured to combine the inverted source signal, the oscillation signal, and the plurality of divided signals and to generate a second delay amount information signal with the information on the given delay amount; and
a first edge-delayed signal output unit configured to generate a first edge-delayed signal with an enable edge, which is more delayed than an enable edge of the source signal by the given delay amount in response to the first delay amount information signal, and with a disable edge, which is more delayed than a disable edge of the source signal by the given delay amount in response to the second delay amount information signal.

7. The semiconductor device of claim 6, further comprising an enable signal generation unit configured to generate the enable signal, wherein the enable signal is enabled when the source signal is enabled, disabled in response to the first delay amount information signal, enabled when the source signal is disabled, and disabled in response to the second delay amount information signal.

8. The semiconductor device of claim 7, wherein the enable signal generation unit comprises:
a control signal generation unit for generating a control signal in response to a reset signal and the first and the second delay amount information signals; and
an enable signal generation unit for generating the enable signal in response to the control signal, the reset signal, the source signal, and the first and the second delay amount information signals.

9. The semiconductor device of claim 8, wherein the control signal generation unit comprises:
a first driving unit configured to drive a first driving node at a first voltage in response to the reset signal;

a second driving unit configured to drive the first driving node at a second voltage in response to the first delay amount information signal;

a third driving unit configured to drive the first driving node at the first voltage in response to an inverted signal of the second delay amount information signal; and a first latch unit coupled between the first driving node and an output node of the control signal.

10. The semiconductor device of claim 8, wherein the enable signal generation unit comprises:

an output control unit configured to output the source signal or the inverted source signal in response to the control signal;

a driving unit configured to drive a second driving node at a given voltage in response to an output signal of the output control unit, the reset signal, and the first and the second delay amount information signals; and a second latch unit coupled between the second driving node and an output node of the enable signal.

11. The semiconductor device of claim 10, wherein the output control unit comprises:

a first path providing unit for non-inverting and outputting the source signal in response to the control signal; and a second path providing unit for inverting the source signal in response to the control signal and outputting an inverted source signal.

12. The semiconductor device of claim 10, wherein the driving unit comprises:

a pulse signal generation unit for generating a pulse signal enabled for a given pulse period when an output signal of the output control unit shifts;

a fourth driving unit for driving the second driving node at a first voltage in response to the pulse signal;

a fifth driving unit for driving the second driving node at a second voltage in response to the first delay amount information signal;

a sixth driving unit for driving the second driving node at the second voltage in response to the second delay amount information signal; and a seventh driving unit for driving the second driving node at the second voltage in response to the reset signal.

13. The semiconductor device of claim 6, wherein the first delay amount determination unit enables the first delay amount information signal when the source signal and the plurality of divided signals have a given code value, and the second delay amount determination unit enables the second delay amount information signal when the inverted source signal and the plurality of divided signals have the given code value.

14. The semiconductor device of claim 6, further comprising a second edge-delayed signal output unit for generating a second edge-delayed signal by combining the source signal and the first edge-delayed signal.

15. The semiconductor device of claim 14, wherein the first edge-delayed signal is an enabling signal for a bit line sense amplifier, and the second edge-delayed signal is a driving signal for a word line.

16. The semiconductor device of claim 6, wherein the oscillation unit receives an internal voltage as a driving voltage and the oscillation signal is level-shifted before supplied to the division unit.

17. A method of driving a semiconductor device, comprising:

counting an oscillation signal when an active signal is enabled and enabling a first delay amount information signal after a first period corresponding to a given delay amount, and counting the oscillation signal when the active signal is disabled and enabling a second delay amount information signal after a second period corresponding to the given delay amount; and generating a first edge-delayed signal and a second edge-delayed signal, obtained by delaying a rising edge and a falling edge of the active signal by the given delay amount, in response to the active signal and the first and the second delay amount information signals.

18. The method of claim 17, wherein the oscillation signal is generated for a section in which the enable signal is enabled, and the enable signal is enabled from a time point at which the active signal is enabled to a time point at which the first delay amount information signal is enabled and is enabled from a time point at which the active signal is disabled to a time point at which the second delay amount information signal is enabled.

19. The method of claim 17, wherein the first edge-delayed signal is an enabling signal for a bit line sense amplifier, and the second edge-delayed signal is a driving signal for a word line.

* * * * *